United States Patent
Lee

Patent Number: 5,376,179
Date of Patent: Dec. 27, 1994

[54] ATOM COLLIMATOR

[75] Inventor: Kyeong B. Lee, Bubaleub, Rep. of Korea

[73] Assignee: Hyundai Electronics Industries Co., Ltd., Rep. of Korea

[21] Appl. No.: 173,994

[22] Filed: Dec. 28, 1993

[30] Foreign Application Priority Data

Dec. 31, 1992 [KR] Rep. of Korea ............... 1992-28416

[51] Int. Cl.[5] ............................................. C23C 14/00
[52] U.S. Cl. ................................... 118/722; 118/715; 118/720; 250/251
[58] Field of Search ............... 118/715, 720, 722; 250/251

[56] References Cited

U.S. PATENT DOCUMENTS

| | | | |
|---|---|---|---|
| 4,800,840 | 1/1989 | Colton | 118/720 |
| 4,834,021 | 5/1989 | Opresko | 118/720 |
| 5,236,510 | 8/1993 | Brennesholtz | 118/720 |

Primary Examiner—Richard Bueker
Attorney, Agent, or Firm—Merchant, Gould, Smith, Edell, Welter & Schmidt

[57] ABSTRACT

An atom collimator having a square configuration and a curved surface. Thanking for the square configuration, the collimator of this present is prevented from its location above a contact hole of a semiconductor substrate. Either of upper and lower surfaces of the collimator is curved to become a concavity or convexity with a radius of curvature. This collimator is not placed over a contact hole during deposition of a contact of a semiconductor device and has the curved surface with the radius of curvature, thus to cause the atoms to be received by the contact hole of a semiconductor substrate as vertically as possible and to improve the step coverage of the semiconductor device.

1 Claim, 2 Drawing Sheets

ATOM COLLIMATOR

BACKGROUND OF THE INVENTION

1. Field of the Invention

The present invention relates in general to an atom collimator such as used for collimating atoms in forming of a metal contact in a contact hole of a semiconductor substrate and, more particularly, to an atom collimator having a square configuration and a curved surface with a radius of curvature.

2. Description of the Prior Art

Typical atom collimator used for collimation of atoms in a deposition forming of contacts of semiconductor device has a hexagonal honeycomb-type configuration in order to provide the same condition for all the sections of a semiconductor substrate such as a silicon substrate, This typical hexagonal collimator allows specifically oriented atoms to be received by a contact hole of the silicon substrate during a physical vapor deposition (PVD) for forming the contact, such as a metal contact, in the contact hole of the silicon substrate. In this regard, the typical hexagonal collimator achieves no desired good step coverage and no homogeneity of the semiconductor device, FIG. 1 is a view showing the typical hexagonal collimator placed above a wafer formed with a die, and FIG. 2 is a partially enlarged view showing a positional relation between the above typical collimator and a contact hole of the die. In these drawings, the reference numerals 1, 2 and 3 denote the collimator, the die and the contact hole of the die, respectively.

As shown in these drawings, the typical collimator I has a hexagonal configuration in order to provide the same condition for all the sections of the wafer. Hence, the hexagonal collimator displaced above a specified sections of the wafer such that it is placed above the contact hole 3 of the die 2.

As shown in FIG. 2, since the collimator I is placed above the contact hole 3 of the die 2, vertically advancing atoms is blocked by the collimator 1 and not received by the contact hole 3 while atoms advancing with inclined angles of incidence are received by the contact hole 3 in order to form the contact in the contact hole 3.

Hence, it will be noted that the atoms are unevenly received by the contact hole when the hexagonal collimator 1 is placed above the contact hole 3 while there is no problem when the collimator I is placed diverging from the contact hole 3. That is, the conventional hexagonal collimator 1 has a problem that when it is placed above a specified contact hole 3 as shown in FIG. 2, it blocks the vertically advancing atoms but allows the atoms advancing with inclined angles of incidence to be received by the contact hole 3, thus to achieve no desired good step coverage and no homogeneity of the contact hole 3.

SUMMARY OF THE INVENTION

It is, therefore, an:object of the present invention to provide an atom collimator in which the aforementioned problem of the typical hexagonal collimator is overcome and which has a square configuration in order to be prevented from being placed over a contact hole and has a curved surface with a radius of curvature on its upper or lower surface, thus to cause the atoms to be received by the contact hole of a semiconductor substrate as vertically as possible and to improve the step coverage of a semiconductor device.

In order to accomplish the above object, an atom collimator in accordance :with a preferred embodiment of the present invention has a square configuration in order to prevent its location above a contact hole, an upper or lower surface of the collimators being curved to become a concavity or convexity with a radius of curvature.

BRIEF DESCRIPTION OF THE DRAWINGS

The above and other objects, features and other advantages of the present invention will be more clearly understood from the following detailed description taken in conjunction with the accompanying drawings, in which:

FIGS. 5A and 5B are perspective views of square collimators according to different embodiments of the present invention, showing largest and smallest angles of incidence of atoms collimated thereby, in which:

FIG. 5A is a square collimator having a concave surface on its upper surface; and FIG. 5B is a square collimator having a convex surface on its upper surface.

DESCRIPTION OF THE PREFERRED EMBODIMENTS

Figure 1:
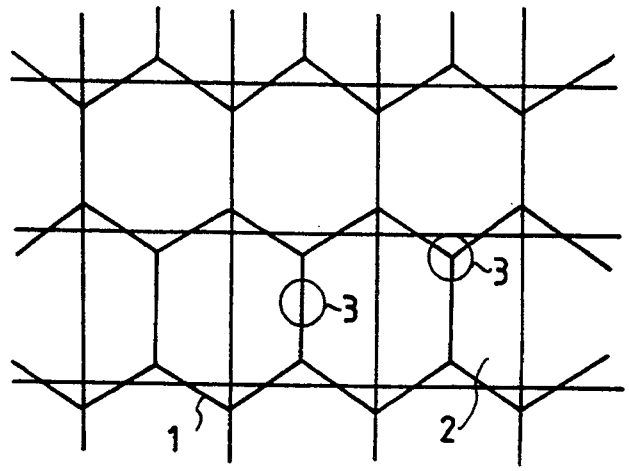
FIG. 1 is a schematic view showing a typical hexagonal honeycomb-type collimator placed above a wafer having a die.
Figure 2:
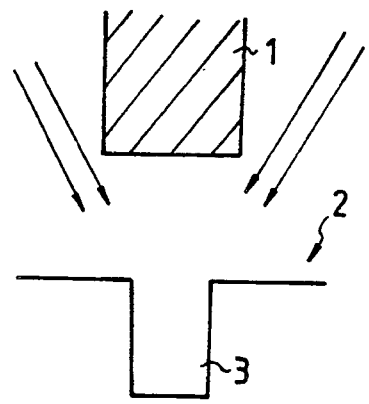
FIG. 2 is a partially enlarged view showing a positional relation between the typical hexagonal collimator and a contact hole of the die.
Figure 3:
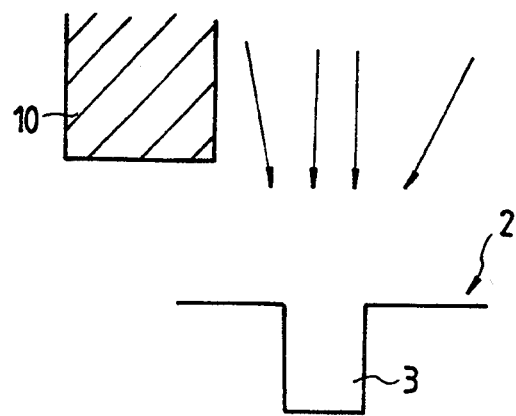
FIG. 3 is a view showing a positional relation between a square collimator of the present invention and a contact hole of a die of a wafer.
Figure 4A:
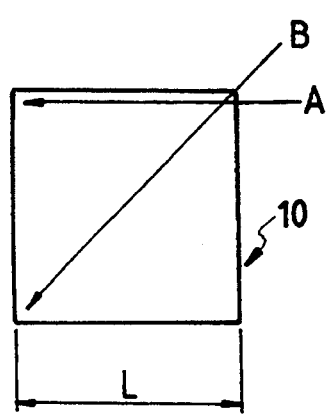
FIG. 4A is a plan view or, the square collimator of the present invention, showing largest and smallest angles of incidence of atoms collimated thereby.
Figure 4B:
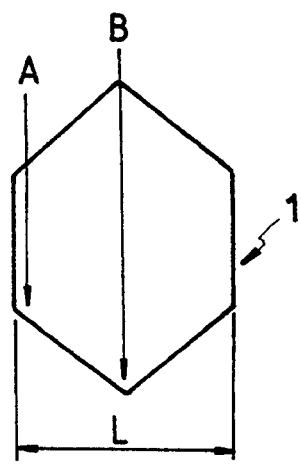
FIG. 4B is a plan view of the typical hexagonal collimator, showing largest and smallest angles of incidence of atoms collimated thereby.
Figure 5A:
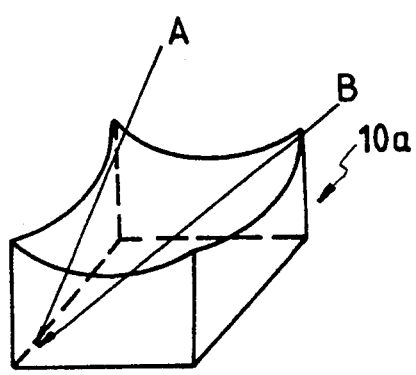
Figure 5B:
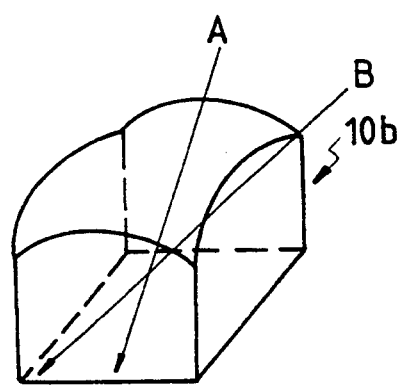

FIG. 3 shows a positional relation between a square collimator of the present invention and a contact hole of a die of a wafer. FIG. 4A is a plan view of the square collimator of the present invention, showing largest and smallest angles of incidence: of atoms collimated thereby, while FIG. 4B is a view corresponding to FIG. 4A, but showing the typical hexagonal collimator in order to be compared with the square collimator of this invention. FIGS. 5A and 5B are perspective views of square collimators according to different embodiments of the present invention, showing largest and smallest angles of incidence of atoms collimated thereby.

As apparent from the above drawings, the present invention provides the square! collimator 10 having a square configuration in order to overcome the problems of the typical hexagonal collimator 1, that is, deterioration of the step coverage of the contact hole. Otherwise stated, the collimator 10 of the present invention is prevented from its location above the contact hole 3 of the die 2 as best seen in FIG. 3. In order to improve the step coverage of the result semiconductor device, the square collimator 10 is such designed that it is not placed above the contact hole 3, thus to cause the atoms to be received by the contact hole 3 as vertically as possible.

The advancing directions of the atoms collimated by the square collimator 10 is shown in FIG. 4A. In accordance with the square collimator 10, the collimated atoms show, in accordance with their advancing directions, a wider range of angles of incidence with respect to the perpendicular of the contact hole 3. The range of the angles of incidence of the atoms collimated by the square collimator 10 is defined by the smallest angle of incidence as shown at the arrow A of FIG. 4A and the largest angle of incidence as shown at the arrow B of this drawing.

In use of a square collimator 10 having an aspect ratio of 1.0, the ratio being defined on the basis of a length L of the collimator 10, the angles of incidence of the atoms collimated by the collimator 10 are ranged from 45.5° to 57.7°. On the contrary, the angles of incidence of the atoms collimated by the typical hexagonal collimator I are ranged from 30.1° to 49.2° as shown in FIG. 4B.

When atoms collimated by the square collimator 10 advance with the largest angle of incidence as shown at the arrow B of FIG. 4A, the physical vapor deposition for forming the contact in the contact hole 3 may introduce a bad step coverage of the result semiconductor device even when the collimator 10 is not placed above the contact hole 3 as shown in FIG. 3.

In order to overcome the bad step coverage caused by the angle of incidence, the upper surface of the square collimator of this invention is preferably curved with a radius of curvature such that it becomes a concavity as shown in FIG. 5A or a convexity as shown in FIG. 5B, Due to provision of the concave or convex surface of the radius of curvature of the collimator, this square collimator results in a better effect of the step coverage in comparison with the typical hexagonal collimator 1. It should be understood that the concave or convex surface may be provided on the lower surface of the square collimator other than the upper surface without affecting the functioning of the present invention.

When the square collimator 10 of this invention has a concave or convex surface of a radius of curvature of 2L on its upper or lower surface and, at the same time, the height of the collimator 10 is increased by 20% to become 1.2L, the range of the angles of incidence of the collimated atoms is narrowed to 43.1°–49.7° in the case of collimator 10a having the concave surface of FIG. 5A, while it is narrowed to 36.9°–49.7° in the case of collimator 10b having the convex surface of FIG. 5B. Otherwise stated, the square collimator 10a or 10b of the present invention provides a desired range of angles of incidence of collimated atoms, which is expected by the typical hexagonal collimator 1, by increasing the height of the collimator by 20–30% and having the concave or convex surface of a radius of curvature.

As described above, the square collimator of the present invention is prevented from its location above a contact hole of a semiconductor substrate, thus to completely expose the contact hole to the outside and to block no atom advancing to the contact hole. In addition, this square collimator is such constructed that it has a concave or convex surface of a radius of curvature on its upper or lower surface, thus to cause the atoms collimated thereby to received by the contact hole with good angles of incidence. Therefore, this square collimator improves the step coverage as well as the homogeneity of a result semiconductor device, thereby improving the reliability and the production yield of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An atom collimator used for collimating atoms in forming a contact of a semiconductor device, wherein the reprovement comprises:
    said collimator having a square configuration for preventing its location above a contact hole of a semiconductor substrate, either of upper and lower surfaces of said collimator being curved with a radius of curvature.

* * * * *

UNITED STATES PATENT AND TRADEMARK OFFICE
CERTIFICATE OF CORRECTION

PATENT NO. : 5,376,179

DATED : Dec. 27, 1994

INVENTOR(S) : Lee

It is certified that error appears in the above-identified patent and that said Letters Patent is hereby corrected as shown below:

In the Abstract, line 3, after the word "present" insert --invention--.

Column 1, line 37, "displaced" should read --1 is placed--.

Column 1, lines 34, 40 and 50, "l" should read --1--.

Column 3, line 18, "l" should read --1--.

Column 2, line 4, after the word "accordance" delete ":".

Column 2, line 7, "collimators" should read --collimator--.

Column 2, line 26, "or," should read --of--.

Column 2, line 48, after the word "incidence" delete ":".

Column 2, line 57, "square!" should read --square--.

Column 4, line 14, "its!" should read --its--.

UNITED STATES PATENT AND TRADEMARK OFFICE
CERTIFICATE OF CORRECTION

PATENT NO. : 5,376,179

DATED : Dec. 27, 1994

INVENTOR(S) : Lee

It is certified that error appears in the above-identified patent and that said Letters Patent is hereby corrected as shown below:

Column 4, line 20, "its::" should read --its--

Column 4, line 37, "reprovement" should read --improvement--.

Signed and Sealed this

Twelfth Day of September, 1995

Attest:

BRUCE LEHMAN

Attesting Officer

Commissioner of Patents and Trademarks